United States Patent [19]

VanSlyke et al.

[11] Patent Number: 5,059,862
[45] Date of Patent: Oct. 22, 1991

[54] ELECTROLUMINESCENT DEVICE WITH IMPROVED CATHODE

[75] Inventors: Steven A. VanSlyke; Ching W. Tang, both of Rochester, N.Y.

[73] Assignee: Eastman Kodak Company, Rochester, N.Y.

[21] Appl. No.: 558,285

[22] Filed: Jul. 26, 1990

[51] Int. Cl.⁵ .................. H05B 33/26; B32B 15/04
[52] U.S. Cl. .................................... 313/503; 313/504; 428/457
[58] Field of Search .............. 313/503, 504, 506; 428/457

[56] References Cited

U.S. PATENT DOCUMENTS

| | | |
|---|---|---|
| 3,530,325 | 9/1970 | Mehl et al. . |
| 3,621,321 | 11/1971 | Williams . |
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang . |
| 4,885,211 | 12/1989 | Tang et al. . |

Primary Examiner—Sandra L. O'Shea
Attorney, Agent, or Firm—Carl O. Thomas

[57] ABSTRACT

An internal junction electroluminescent device is disclosed containing, in sequence, an anode, an organic hole injecting and transporting zone, an organic electron injecting and transporting zone forming a junction with the organic hole injecting and transporting zone, and a cathode comprised of a layer contacting the organic electron injecting and transporting zone containing a combination of magnesium and aluminum. Aluminum accounts for at least 80 percent of the cathode layer.

11 Claims, 2 Drawing Sheets

ELECTROLUMINESCENT DEVICE WITH IMPROVED CATHODE

FIELD OF THE INVENTION

This invention relates to organic electroluminescent devices. More specifically, this invention relates to organic electroluminescent devices which contain separate hole and electron transporting zones.

BACKGROUND OF THE INVENTION

Electroluminescent devices (hereinafter also referred to as EL devices) contain spaced electrodes separated by an electroluminescent medium that emits electromagnetic radiation, typically light, in response to the application of an electrical potential difference across the electrodes. The electroluminescent medium must not only be capable of luminescing, but must also be capable of fabrication in a continuous form (i.e., must be pin hole free) and must be sufficiently stable to facilitate fabrication and to support device operation.

Initially organic EL devices were fabricated using single crystals of organic materials, as illustrated by Mehl et al U.S. Pat. No. 3,530,325 and Williams U.S. Pat. No. 3,621,321. Because single crystal organic electroluminescent layers were relatively difficult to fabricate and further did not readily lend themselves to thin layer constructions in thicknesses below about 50 $\mu$m, the art turned to the use of thin film deposition techniques to form the organic layer of EL devices. Unfortunately, thin film deposition techniques produced devices which exhibited performance efficiencies 1 to 2 orders of magnitude below that obtained with single organic crystal devices.

In the last decade the art has developed a new class of organic EL devices hereinafter referred to as internal junction organic EL devices which lend themselves to thin film deposition techniques for fabrication of the organic layers and which exhibit performance characteristics comparable to or better than those of single organic crystal EL devices. This new class of organic EL devices has been made possible by dividing the organic medium separating the electrodes into a hole injecting and transporting zone and an electron injecting and transporting zone. The interface of the two organic zones constitute an internal junction allowing injection of holes into the electron injecting and transporting zone for recombination and luminescence, but blocking electron injection into the hole injecting and transporting zone. Examples of internal junction organic EL devices are provided by Tang U.S. Pat. No. 4,356,429, VanSlyke et al U.S. Pat. Nos. 4,539,507 and 4,720,432, and Tang et al U.S. Pat. No. 4,769,292.

Internal junction organic EL devices can be driven into luminescence using either an alternating current (AC) or direct current (DC) power source. Since luminescence occurs only when the electrode contacting the electron injecting and transporting zone is more negative than the electrode contacting the hole injecting and transporting zone (i.e., the device is forward biased), the former electrode is referred to as the device cathode while the latter electrode is referred to as the device anode.

While the art has encountered little difficulty in constructing fully acceptable stable anodes for internal junction organic EL devices, cathode construction has been a matter of extended investigation. In selecting a cathode metal, a balance must be struck between metals having the highest electron injecting efficiencies and those having the highest levels of stability. The highest electron injecting efficiencies are obtained with alkali metals, which are too unstable for convenient use, while metals having the highest stabilities show limited electron injection efficiencies and are, in fact, better suited for anode construction.

Tang U.S. Pat. No. 4,356,429 teaches to form cathodes of organic EL devices of metals such as indium, silver, tin, and aluminum. VanSlyke et al U.S. Pat. No. 4,539,507 teaches to form the cathodes of organic EL devices of metals such as silver, tin, lead, magnesium, manganese and aluminum.

Tang et al U.S. Pat. No. 4,885,211 found that a practical and efficient cathode for an internal junction organic EL device could be produced by employing at least 50 percent (atomic basis) magnesium in combination with at least 0.1 percent (atomic basis) of one other metal. Tang et al demonstrated that cathodes constructed entirely of magnesium were too unstable for practical use. Extended internal junction organic EL device operation was demonstrated by substituting for minor proportions of magnesium one or more of the metals silver, indium, tin, titanium, chromium, europium, antimony, tellurium, and manganese. In those instances in which the additional metal was a higher work function metal efficiencies were much higher than when the higher work function metals were used alone. The instability of magnesium only cathodes prevented establishing their efficiency level with certainty. When the proportion of the higher work function metal was increased above 50 percent (atomic basis), illustrated by a magnesium-silver concentration series, the initial and extended performance efficiencies of the cathode were significantly reduced. Apart from listing aluminum among known high (>4.0 eV) work function metals, Tang et al contains no teaching relating specifically to the construction of aluminum containing electrodes.

RELATED PATENT APPLICATIONS

VanSlyke et al (II) U.S. Ser. No. 561,552, concurrently filed and commonly assigned, titled ELECTROLUMINESCENT DEVICE WITH ORGANIC ELECTROLUMINESCENT MEDIUM, discloses an internal junction organic EL device in which the hole injecting and transporting zone includes an aromatic tertiary amine containing at least two tertiary amine moieties and including attached to a tertiary amine nitrogen atom an aromatic moiety containing at least two fused aromatic rings.

SUMMARY OF THE INVENTION

In one aspect this invention is directed to an internal junction electroluminescent device comprising in sequence, an anode, an organic hole injecting and transporting zone, an organic electron injecting and transporting zone forming a junction with organic hole transporting zone, and a cathode comprised of a layer contacting the organic electron injecting and transporting zone containing a combination of magnesium and at least one higher work function metal. The invention is characterized in that aluminum accounts for at least 80 percent of the cathode layer.

The invention is predicated on the discovery that only minor amounts of magnesium are required to obtain the electron injection efficiencies magnesium is capable of imparting to the cathode layer. At the same time, by employing aluminum as the major component of the cathode layer it is possible to construct a more practical and stable cathode. Employing aluminum as a major component in cathode construction of internal junction EL devices has the advantage that it is entirely compatible with the aluminum contact systems widely employed in integrated and hybrid circuitry and allows the cathodes of the internal junction EL devices to be fabricated and patterned by the same procedures. The magnesium and aluminum containing cathodes of the internal junction EL devices exhibit high levels of stability, both in fabrication and in subsequent use. Further, the layer nonuniformities demonstrated by Tang et al to occur with magnesium only cathodes are avoided.

DESCRIPTION OF PREFERRED EMBODIMENTS

Figure 1:
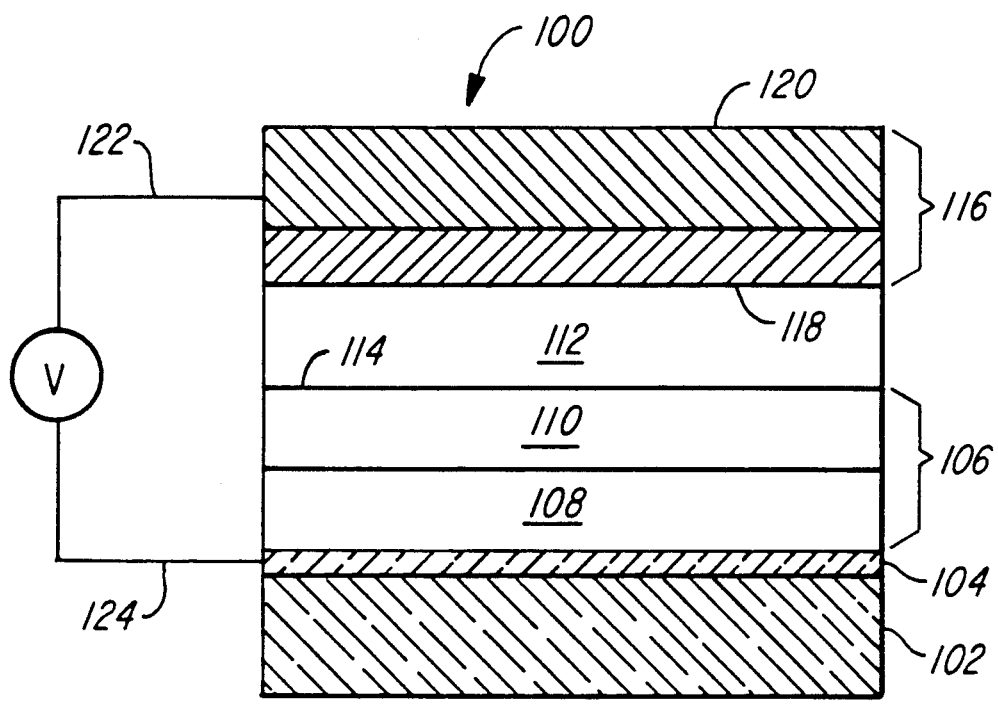
FIG. 1 is a schematic diagram of an internal junction organic EL device according to the invention.

A preferred internal junction organic EL device 100 satisfying the requirements of the invention is shown in FIG. 1. The device is comprised of a transparent support 102 onto which is coated a transparent conductive layer 104. The transparent support and the transparent conductive layer together form a transparent anode element of the device. Overlying and in contact with the transparent conductive layer is a hole injecting and transporting zone 106. In the preferred form of the invention the hole injecting zone consists of a hole injecting layer 108 and a hole transporting layer 110. An electron injecting and transporting zone is provided by layer 112, which forms a junction 114 with the hole injecting and transporting zone, specifically the hole transporting layer 110.

Overlying and in contact with the organic electron injecting and transporting zone, specifically layer 112, is a cathode 116 comprised of an interfacial layer 118 located in contact with the electron injecting and transporting zone, specifically the layer 112. Overlying the interfacial layer of the cathode is capping layer 120 chosen to achieve minimal cathode resistance.

In operation, a voltage source V is connected to the anode conductive layer 104 by electrical conductor 122 and to the cathode 116 by electrical conductor 124. When the voltage source is a continuous or interrupted DC voltage source the voltage source biases the cathode negative with respect to the anode to drive the internal junction organic EL device into luminescence. When the voltage source is an AC source, the cathode is biased negative with respect to the anode during half of each cycle.

With the cathode biased negative with respect to the anode electrons are injected into the electron injecting and transporting zone represented by layer 112. The efficiency of electron injection is controlled by the interfacial layer 118 of the cathode. Concurrently, at the anode conductive layer 104 holes are injected into the hole injecting and transporting zone 106. Specifically, holes are injected into hole injecting layer 108 and then transported to the hole transporting layer 110. Holes are transported within the hole transporting layer and across the junction 114 to the electron injecting and transporting zone. Hole-electron recombination occurs in the electron injecting and transporting zone. As the electron moves out of the conduction band into a valence band vacancy energy is released in the form of electromagnetic radiation—i.e., luminescence occurs.

The present invention is based on the discovery that a cathode which has at least its interfacial layer contacting the electron injecting and transporting zone formed of only a minor amount of magnesium and a major amount of aluminum can exhibit both high levels of stability in fabrication and use and additionally is capable of realizing electron injection efficiencies comparable to those previously obtained only by constructing the cathode of greater than 50 percent (atomic basis) magnesium Several alternative cathode constructions are possible:

I. The interfacial layer and the backing layer of the cathode can be of the same composition—i.e., the cathode can be a unitary single layer element. In this instance the cathode contains magnesium and aluminum in the same proportion throughout.

II. The cathode contains magnesium and aluminum throughout, but magnesium is present in a reduced proportion in the backing layer.

III. The cathode contains magnesium and aluminum in the interfacial layer and aluminum without magnesium in the backing layer.

IV. The cathode contains magnesium and aluminum in the interfacial layer and one or a combination of other metals in the backing layer.

The constant feature of all embodiments is that the interfacial layer contains magnesium and at least 80 percent aluminum. (Except as otherwise indicated, percent is in each instance weight percent based on total weight.) In the simplest possible construction the cathode interfacial layer consists essentially of magnesium and aluminum. At least about 0.05 percent, preferably at least 0.10 percent, magnesium is present in the interfacial layer. Magnesium can be present in the interfacial layer in a concentration of up to 20 percent, but is preferably present in a concentration of up to 10 percent.

So long as the required concentrations of magnesium and aluminum are present minor amounts of other metals can be tolerated. It is generally preferred that any other metal present have a work function more positive than that of magnesium, since magnesium alone is capable of providing the electron injection efficiencies sought and the stability of a metal generally increases with increasing work function levels. Minor amounts (< about 5%) of one or more of the elements commonly present in aluminum electronic contact systems are specifically contemplated, such as silicon, copper, titanium, germanium, tin and gallium.

Any thickness of the interfacial layer of the cathode capable of covering the surface of the layer forming the electron injecting and transporting zone can be employed in constructing the internal junction organic EL device. Generally, an interfacial layer thickness of at least 25Å, preferably at least 50Å and optimally at least 100Å, is contemplated. The overall thickness of the cathode can be varied in any convenient manner to accommodate specific application requirements. When thin film deposition techniques such as vacuum vapor deposition or sputtering are employed to form the cathode, cathode thicknesses of up to about 2 μm can be conveniently constructed, with cathode thicknesses of up to about 5000Å being preferred.

The surprisingly low levels of magnesium required for efficient device operation allow the entire cathode to be constructed of a low magnesium content that lends itself to the fabrication techniques conventionally employed in constructing aluminum contact systems for integrated and hydrid circuits. The aluminum composition is particularly advantageous for forming patterned cathode arrangements, such as those required for internal junction organic EL device arrays. A typical array of this type is demonstrated by European Patent Application No. 349,265, published Mar. 14, 1990, the disclosure of which is here incorporated by reference.

The remaining features of the internal junction organic EL devices of the invention can take a variety of forms. Any one of the internal junction organic EL device constructions disclosed by Tang U.S. Pat. No. 4,356,429, VanSlyke et al U.S. Pat. No. 4,539,507, Tang et al U.S. Pat. No. 4,769,292 and Tang et al U.S. Pat. No. 4,885,211, each cited above and here incorporated by reference, can be combined with the particular cathode construction of this invention to produce an improved internal junction organic EL device. Device constructions shown in these references in which luminescence occurs through the cathode are compatible with the invention. The cathodes in such devices preferably consist of only the interfacial layer and are optimally less than 300Å in thickness.

In a preferred form of the invention a layer containing a porphyrinic compound forms the hole injecting layer of the internal junction organic EL device. A porphyrinic compound is any compound, natural or synthetic, which is derived from or includes the porphyrin structure. Any of the porphyrinic compounds disclosed by Adler U.S. Pat. No. 3,935,031 or Tang U.S. Pat. No. 4,356,429, the disclosures of which are here incorporated by reference, can be employed.

Preferred porphyrinic compounds are those of structural formula (I):

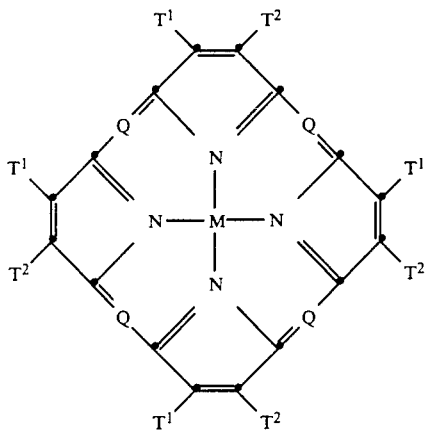

wherein
Q is —N═ or —C(R)═;
M is a metal, metal oxide, or metal halide;
R is hydrogen, alkyl, aralkyl, aryl, or alkaryl, and
$T^1$ and $T^2$ represent hydrogen or together complete a unsaturated 6 membered ring, which can include substituents, such as alkyl or halogen. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogen for the metal atom, as indicated by formula (II):

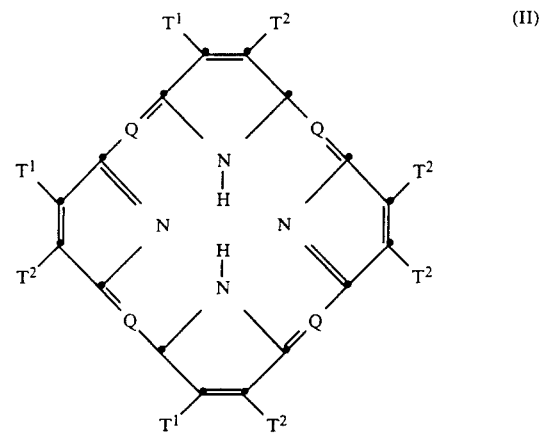

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:
PC-1: Porphine
PC-2: 1,10,15,20-Tetraphenyl-21H,23H-porphine copper (II)
PC-3: 1,10,15,20-Tetraphenyl-21H,23H-porphine zinc (II)
PC-4: 5,10,15,20-Tetrakis (pentafluorophenyl)-21H,23H-porphine
PC-5: Silicon phthalocyanine oxide
PC-6: Aluminum phthalocyanine chloride
PC-7: Phthalocyanine (metal free)
PC-8: Dilithium phthalocyanine
PC-9: Copper tetramethylphthalocyanine
PC-10: Copper phthalocyanine
PC-11: Chromium phthalocyanine fluoride
PC-12: Zinc phthalocyanine
PC-13: Lead phthalocyanine
PC-14: Titanium phthalocyanine oxide
PC-15: Magnesium phthalocyanine
PC-16: Copper octamethylphthalocyanine The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III):

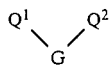

wherein

Q¹ and Q² are independently aromatic tertiary amine moieties and

G is a linking group such an arylene, cycloalkylene, or alkylene group or a carbon to carbon bond.

A particularly preferred class of triarylamines satisfying structural formula (III) and containing two triarylamine moieties are those satisfying structural formula (IV):

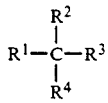

where $R^1$ and $R^2$ each independently represents a hydrogen atom, an aryl group or alkyl group or $R^1$ and $R^2$ together represent the atoms completing a cycloalkyl group and $R^3$ and $R^4$ each independently represents an aryl group which is in turn substituted with a diaryl substituted amino group, as indicated by structural formula (V):

wherein $R^5$ and $R^6$ are independently selected aryl groups.

Another preferred class of aromatic tertiary amines are tetraaryldiamines. Preferred tetraaryldiamines include two diarylamino groups, such as indicated by formula (V), linked through an arylene group. Preferred tetraaryldiamines include those represented by formula (VI).

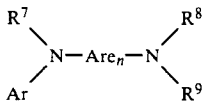

wherein

Are is an arylene group, n is an integer of from 1 to 4, and

Ar, $R^7$, $R^8$, and $R^9$ are independently selected aryl groups.

The various alkyl, alkylene, aryl, and arylene moieties of the foregoing structural formulae (III), (IV), (V), and (VI) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 5 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

While the entire hole transporting layer of the organic electroluminesce medium can be formed of a single aromatic tertiary amine, it is a further recognition of this invention that increased stability can be realized by employing a combination of aromatic tertiary amines. Specifically, as demonstrated in the examples below, it has been observed that employing a triarylamine, such as a triarylamine satisfying formula (IV), in combination with a tetraaryldiamine, such as indicated by formula (VI), can be advantageous. When a triarylamine is employed in combination with a tetraaryldiamine, the latter is positioned as a layer interposed between the triarylamine and the electron injecting and transporting layer.

Representative useful aromatic tertiary amines are disclosed by Berwick et al U.S. Pat. No. 4,175,960 and VanSlyke et al U.S. Pat. No. 4,539,507, here incorporated by reference. Berwick et al in addition discloses as useful hole transporting compounds N substituted carbazoles, which can be viewed as ring bridged variants of the diaryl and triarylamines disclosed above.

Following the teachings of VanSlyke et al (II), cited above, it is possible to achieve higher organic EL device stabilities both during short term and extended operation by substituting for one or more of the aryl groups attached directly to a tertiary nitrogen atom in the aromatic tertiary amines described above an aromatic moiety containing at least two fused aromatic rings. The best combination of both short term (0-50 hours) and long term (0-300+ hours) of operation are achieved when the aromatic tertiary amines are those which (1) are comprised of at least two tertiary amine moieties and (2) include attached to a tertiary amine nitrogen atom an aromatic moiety containing at least two fused aromatic rings. The following is a listing of exemplary aromatic compounds containing at least two fused aromatic rings and from 10 to 24 ring carbon atoms:

Naphthalene,
Azulene,
Heptalene,
as-Indacene,
s-Indacene,
Acenaphthylene,
Phenalene,
Phenanthrene,
Anthracene,
Fluoranthrene,
Acephenathrylene,
Aceantrylene,
Triphenylene,
Pyrene,
Chrysene,
Naphthacene,
Pleiadene,
Picene,
Perylene,
Pentaphene,
Hexaphene,
Rubicene, and
Coronene.

The fused aromatic ring moieties of the tertiary amines preferably contain from about 10 to 16 ring carbon atoms. While unsaturated 5 and 7 membered rings can be fused to six membered aromatic rings (i.e., benzene rings) to form useful fused aromatic ring moieties, it is generally preferred that the fused aromatic ring moiety include at least two fused benzene rings. The simplest form of a fused aromatic ring moiety containing two fused benzene rings is naphthalene. Therefore, the preferred aromatic ring moieties are naphthalene moieties, where the latter is understood to embrace all compounds containing a naphthalene ring structure. In monovalent form the naphthalene moieties are naphthyl moieties, and in their divalent form the naphthalene moieties are naphthylene moieties.

Illustrative of useful aromatic tertiary amines are the following:

ATA-1: 1,1-Bis(4-di-p-tolylaminophenyl)-cyclohexane
ATA-2: 1,1-Bis(4-di-p-tolylaminophenyl)-4-phenylcyclohexane
ATA-3: 4,4′-Bis(diphenylamino)quadriphenyl
ATA-4: Bis(4-dimethylamino-2-methylphenyl)-phenylmethane
ATA-5: N,N,N-Tri(p-tolyl)amine
ATA-6: 4-(di-p-tolylamino)-4′-[4(di-p-tolyl-amino)-styryl]stilbene
ATA-7: N,N,N′,N′-Tetra-p-tolyl-4,4′-diamino-biphenyl
ATA-8: N,N,N′,N′-Tetraphenyl-4,4′-diamino-biphenyl
ATA-9: N-Phenylcarbazole
ATA-10: Poly(N-vinylcarbazole)
ATA-11: 4,4′-Bis[N-(1-naphthyl)-N-phenylamino]-biphenyl
ATA-12: 4,4″-Bis[N-(1-naphthyl)-N-phenylamino]-p-terphenyl
ATA-13: 4,4′-Bis[N-(2-naphthyl)-N-phenylamino]-biphenyl
ATA-14: 4,4′-Bis-[N-(3-acenaphthenyl)-N-phenyl-amino]biphenyl
ATA-15: 1,5-Bis[N-(1-naphthyl)-N-phenylamino]-naphthalene
ATA-16: 4,4′-Bis[N-(9-anthryl)-N-phenylamino]-biphenyl
ATA-17: 4,4″-Bis[N-(1-anthryl)-N-phenylamino]-p-terphenyl
ATA-18: 4,4′-Bis[N-(2-phenanthryl)-N-phenyl-amino]-biphenyl
ATA-19: 4,4′-Bis[N-(8-fluoranthenyl)-N-phenyl-amino]biphenyl
ATA-20: 4,4′-Bis[N-(2-pyrenyl)-N-phenylamino]biphenyl
ATA-21: 4,4′-Bis[N-(2-naphthacenyl)-N-phenyl-amino]biphenyl
ATA-22: 4,4′-Bis[N-(2-perylenyl)-N-phenylamino]-biphenyl
ATA-23: 4,4′-Bis[N-(1-coronenyl)-N-phenylamino]-biphenyl
ATA-24: 2,6-Bis(di-p-tolylamino)naphthalene
ATA-25: 2,6-Bis[di-(1-naphthyl)amino]naphthalene
ATA-26: 2,6-Bis[N-(1-naphthyl)-N-(2-naphthyl)-amino]naphthalene
ATA-27: 4,4″-Bis[N,N-di(2-naphthyl)amino]terphenyl
ATA-28: 4,4′-Bis{N-phenyl-N-[4-(1-naphthyl)-phenyl]amino}biphenyl
ATA-29: 4,4′-Bis[N-phenyl-N-(2-pyrenyl)amino]-biphenyl
ATA-30: 2,6-Bis[N,N-di(2-naphthyl)amine]fluorene
ATA-31: 4,4″-Bis(N,N-di-p-tolylamino)terphenyl
ATA-32: Bis(N-1-naphthyl)(N-2-naphthyl)amine Any conventional electron injecting and transporting compound or compounds can be employed in forming the layer of the organic electroluminescent medium adjacent the cathode. This layer can be formed by historically taught luminescent materials, such as anthracene, naphthalene, phenanthrene, pyrene, chrysene, and perylene and other fused ring luminescent materials containing up to about 8 fused rings as illustrated by Gurnee et al U.S. Pat. No. 3,172,862, Gurnee U.S. Pat. No. 3,173,050, Dresner, "Double Injection Electroluminescence in Anthracene", RCA Review, Vol. 30, pp. 322-334, 1969; and Dresner U.S. Pat. No. 3,710,167, cited above. Although such fused ring luminescent materials do not lend themselves to forming thin ($<1$ $\mu$m) films and therefore do not lend themselves to achieving the highest attainable EL device performance levels, organic EL devices incorporating such luminescent materials when constructed according to the invention show improvements in performance and stability over otherwise comparable prior art EL devices.

Among electron transporting compounds useful in forming thin films are the butadienes, such as 1,4-diphenylbutadiene and tetraphenylbutadiene; coumarins; and stilbenes, such as trans-stilbene, disclosed by Tang U.S. Pat. No. 4,356,429, cited above.

Still other thin film forming electron transporting compounds which can be used to form the layer adjacent the cathode are optical brighteners, particularly those disclosed by VanSlyke et al U.S. U.S. Pat. No. 4,539,507, cited above and here incorporated by reference. Useful optical brighteners include those satisfying structural formulae (VII) and (VIII):

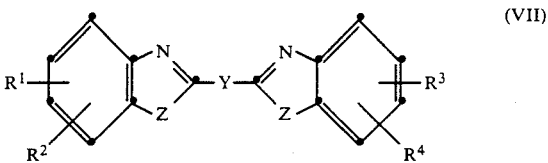

(VII)

or

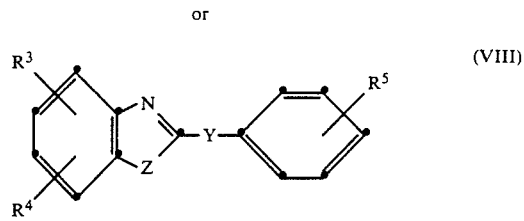

(VIII)

wherein $R^1$, $R^2$, $R^3$, and $R^4$ are individually hydrogen; saturated aliphatic of from 1 to 10 carbon atoms, for example, propyl, t-butyl, heptyl, and the like; aryl of from 6 to 10 carbon atoms, for example, phenyl and naphthyl; or halo such as chloro, fluoro, and the like; or $R^1$ and $R^2$ or $R^3$ and $R^4$ taken together comprise the atoms necessary to complete a fused aromatic ring optionally bearing at least one saturated aliphatic of from 1 to 10 carbon atoms, such as methyl, ethyl, propyl and the like;

$R^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (VII) at least two of $R^3$, $R^4$ and $R^5$ are saturated aliphatic of from 3 to 10 carbon atoms, e.g., propyl, butyl, heptyl and the like;

Z is $-O-$, $-NH-$, or $-S-$; and

Y is $-R^6 +CH=CH\overline{)_n}R^6-$, 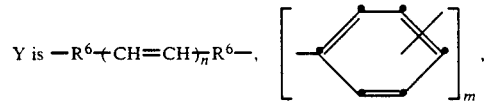

-continued

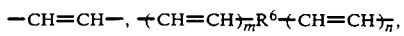

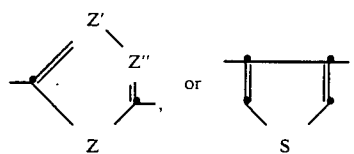

wherein m is an integer of from 0 to 4;

n is arylene of from 6 to 10 carbon atoms, for example, phenylene and naphthylene; and Z' and Z" are individually N or CH. As used herein "aliphatic" includes substituted aliphatic as well as unsubstituted aliphatic. The substituents in the case of substituted aliphatic include alkyl of from 1 to 5 carbon atoms, for example, methyl, ethyl, propyl and the like; aryl of from 6 to 10 carbon atoms, for example, phenyl and naphthyl; halo, such as chloro, fluoro and the like; nitro; and alkoxy having 1 to 5 carbon atoms, for example, methoxy, ethoxy, propoxy, and the like.

Still other optical brighteners that are contemplated to be useful are listed in Vol. 5 of *Chemistry of Synthetic Dyes*, 1971, pages 618–637 and 640. Those that are not already thin-film-forming can be rendered so by attaching an aliphatic moiety to one or both end rings.

Particularly preferred for use in forming the electron injecting and transporting layers of the organic EL devices of this inventions are metal chelated oxinoid compounds, including chelates of oxine (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (IX):

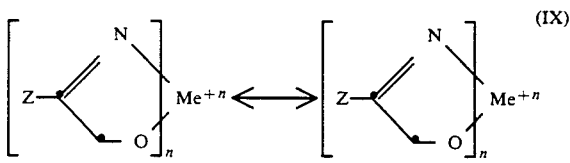

wherein

Me represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

CO-1: Aluminum trisoxine [a.k.a., tris(8-quinolinol) aluminum]

CO-2: Magnesium bisoxine [a.k.a., bis(8-quinolinol) magnesium]

CO-3: Bis[benzo{f}-8-quinolinol] zinc

CO-4: Tris(2-methyl-8-quinolinolato) aluminum

CO-5: Indium trisoxine [a.k.a., tris(8-quinolinol) indium]

CO-6: Aluminum tris(5-methyloxine) [a.k.a., tris(5-methyl-8-quinolinol) aluminum CO-7: Lithium oxine (a.k.a., 8-quinolinol lithium]

CO-8: Gallium tris(5-chlorooxine) [a.k.a., tris(5-chloro-8-quinolinol) gallium]

CO-9: Calcium bis(5-chlorooxine) [a.k.a., bis(5-chloro-8-quinolinol) calcium]

CO-10: Poly[zinc (II)-bis(8-hydroxy-5-quinolinyl)methane]

CO-11: Dilithium epindolidione

It is possible to modify the wavelength of emission from the electron injecting and transporting zone and, in some instances, to increase the stability of the organic EL device in operation by incorporating in the electron injecting and transporting zone a dye capable of emitting light in response to hole-electron recombination. To be useful for this purpose the dye must have a bandgap no larger than that of the host material in which it is dispersed and a reduction potential less negative than that of the host material. Tang et al U.S. Pat. No. 4,769,292, the disclosure of which is here incorporated by reference, describes internal junction organic EL devices containing dyes selected from a variety of classes dispersed in electron injecting and transporting zone host materials.

In the organic EL devices of the invention it is possible to maintain a current density compatible with efficient light emission while employing a relatively low voltage across the electrodes by limiting the total thickness of the organic electroluminescent medium to less than 1 μm (10,000 Angstroms). At a thickness of less than 1 μm an applied voltage of 20 volts results in a field potential of greater than $2 \times 10^5$ volts/cm, which is compatible with efficient light emission. An order of magnitude reduction (to 0.1 μm or 1000 Angstroms) in thickness of the organic electroluminescent medium, allowing further reductions in applied voltage and/or increase in the field potential and hence current density, are well within device construction capabilities.

One function which the organic electroluminescent medium performs is to provide a dielectric barrier to prevent shorting of the electrodes on electrical biasing of the EL device. Even a single pin hole extending through the organic electroluminescent medium will allow shorting to occur. Unlike conventional EL devices employing a single highly crystalline electroluminescent material, such as anthracene, for example, the EL devices of this invention are capable of fabrication at very low overall organic electroluminescent medium thicknesses without shorting. One reason is that the presence of three superimposed layers greatly reduces the chance of pin holes in the layers being aligned to provide a continuous conduction path between the electrodes. This in itself permits one or even two of the layers of the organic electroluminescent medium to be formed of materials which are not ideally suited for film formation on coating while still achieving acceptable EL device performance and reliability.

The preferred materials for forming the organic electroluminescent medium are each capable of fabrication in the form of a thin film—that is, capable of being fabricated as a continuous layer having a thickness of less than 0.5 μm or 5000 Angstroms.

When one or more of the layers of the organic electroluminescent medium are solvent coated, a film forming polymeric binder can be conveniently co-deposited with the active material to assure a continuous layer free of structural defects, such as pin holes. If employed, a binder must, of course, itself exhibit a high dielectric strength, preferably at least about $2 \times 10^6$ volt/cm. Suitable polymers can be chosen from a wide variety of known solvent cast addition and condensation polymers. Illustrative of suitable addition polymers are polymers and copolymers (including terpolymers) of styrene, t-butylstyrene, N-vinyl carbazole, vinyltoluene, methyl methacrylate, methyl acrylate, acrylonitrile, and vinyl acetate. Illustrative of suitable condensation polymers are polyesters, polycarbonates, polyimides, and polysulfones. To avoid unnecessary dilution of the active material binders are preferably limited to less than 50 percent by weight, based on the total weight of the material forming the layer.

The preferred active materials forming the organic electroluminescent medium are both film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited porphorinic compound as a hole injecting layer, a film forming aromatic tertiary amine as a hole transporting layer, and a chelated oxinoid compound as an electron injecting and transporting layer, thicknesses in the range of from about 50 to 5000 Angstroms are contemplated, with layer thicknesses in the range of from 100 to 2000 Angstroms being preferred. It is generally preferred that the overall thickness of the organic electroluminescent medium be at least about 1000 Angstroms.

The anode of the organic EL device can take any convenient conventional form. Where it is intended to transmit light from the organic EL device through the anode, this can be conveniently achieved by coating a thin conductive layer onto a light transmissive substrate—e.g., a transparent or substantially transparent glass plate or plastic film. In one form the organic EL devices of this invention can follow the historical practice of including a light transmissive anode formed of tin oxide or indium tin oxide (ITO) coated on a glass plate, as disclosed by Gurnee et. al. U.S. Pat. No. 3,172,862, Gurnee U.S. Pat. No. 3,173,050, Dresner, "Double Injection Electroluminescence in Anthracene", *RCA Review*, Vol. 30, pp. 322-334, 1969; and Dresner U.S. Pat. No. 3,710,167, cited above. While any light transmissive polymeric film can be employed as a substrate, Gillson U.S. Pat. No. 2,733,367 and Swindells U.S. Pat. No. 2,941,104 disclose polymeric films specifically selected for this purpose.

As employed herein the term "light transmissive" means simply that the layer or element under discussion transmits greater than 50 percent of the light of at least one wavelength it receives and preferably over at least a 100 nm interval. Since both specular (unscattered) and diffused (scattered) emitted light are desirable device outputs, both translucent and transparent or substantially transparent materials are useful. In most instances the light transmissive layers or elements of the organic EL device are also colorless or of neutral optical density—that is, exhibiting no markedly higher absorption of light in one wavelength range as compared to another. However, it is, of course, recognized that the light transmissive electrode supports or separate superimposed films or elements can be tailored in their light absorption properties to act as emission trimming filters, if desired. Such an electrode construction is disclosed, for example, by Fleming U.S. Pat. No. 4,035,686. The light transmissive conductive layers of the electrodes, where fabricated of thicknesses approximating the wavelengths or multiples of the light wavelengths received can act as interference filters.

EXAMPLES

The invention and its advantages are further illustrated by the specific examples which follow. The term "cell" as employed in the examples denotes an organic EL device. Examples with a number bearing the suffix E represent embodiments of the invention while Examples with a number bearing the suffix C are included for the purpose of comparing variations in construction.

EXAMPLE 1E PREPARATION OF AN INTERNAL JUNCTION ORGANIC DEVICE WITH A TWO LAYER CATHODE

An internal junction organic EL device containing a two layer cathode was prepared in the following manner:

a) A transparent anode of ITO coated glass was ultrasonically cleaned in a 3% solution of Deconex TM 12PA detergent (Borer Chemie AG) for a few minutes. It was then rinsed with deionized water and isopropyl alcohol, and finally immersed in toluene vapor for about 15 minutes.

b) A hole injecting layer (375Å) of copper phthalocyanine was deposited onto the anode by vacuum deposition. It was sublimed from a quartz boat heated by a tungsten filament.

c) A hole transporting layer (375Å) of N,N,N',N'-tetra-p-tolyl-4,4'-diaminobiphenyl was deposited on top of the copper phthalocyanine. It was also evaporated from a quartz boat.

d) An electron injecting and transporting layer (600Å) of tris(8-quinolinol) aluminum was then deposited on top of the hole transporting layer, again by sublimation from a quartz boat.

e) On top of the tris(8-quinolinol) aluminum was then deposited a mixed metal (200Å) of magnesium and aluminum in a volume ratio of 1:50. This was accomplished by subliming Mg from a resistively heated tantalum boat while simultaneously evaporating aluminum from an electron beam heated graphite crucible.

f) On top of the mixed metal was then deposited 2000Å of pure aluminum, again from an electron beam heated graphite crucible, as a capping layer, steps e) and f) together completing the cathode.

When a negative voltage was connected to the cathode and the anode was connected to ground, luminescence was visible through the transparent anode. The efficiency of the device (optical output in watts per ampere of electrical current passing through the cell) was 0.014 Watt/Amp. At a current density of 20 mA/cm$^2$, the drive voltage was 9.1 volts and the emission intensity was 0.28 mW/cm$^2$. The cell characteristics are shown in Table I.

EXAMPLE 2C A SINGLE LAYER CATHODE OF PURE ALUMINUM.

An internal junction organic EL device was constructed identically to that of Example 1E, except a pure aluminum layer (2000Å) was deposited on top of the organic films. The efficiency of this cell was 0.010 W/A. At 20 mA/cm$^2$ the drive voltage was 12.5 volts and the light intensity was 0.20 mW/cm$^2$ (Table I). The poorer characteristics of this cell demonstrate that for optimum performance, magnesium needs to be mixed with aluminum.

EXAMPLES 3E, 4C AND 5C SINGLE LAYER Mg:Al CATHODES WITH A RANGE OF CONCENTRATIONS

Internal junction organic EL devices were constructed identically to that of Example 1E, except the Mg:Al volume ratios were 1:20, 1:1 and 10:1. The thickness of the mixed layers in each case was about 2000Å and no aluminum capping layer was deposited. These devices exhibited comparable behavior to the device of Example 1E as set forth in Table I and demonstrate that the electron injection efficiency is only minimally dependent on the magnesium concentration for Mg:Al cathodes.

EXAMPLES 6E, 7C AND 8C TWO LAYER Al:Mg/Al CATHODES WITH A RANGE OF CONCENTRATIONS.

Internal junction organic El devices were constructed identically to that of Example 1E, except that the concentration of the mixed layer adjacent to the organic electroluminescent medium was varied. As shown in Table I, these cells show only a minimal concentration dependence and behave comparably to Example 1E. This demonstrates that even though the mixed layer thickness is quite thin, the cathode properties are relatively unaffected.

EXAMPLES 9C, 10C AND 11C COMPARISON OF Al:Mg WITH Mg:Ag CATHODES

Two layer cathodes of Al:Mg/Al and Mg:Ag/Al were prepared as in Example 1E, except that in one sample Ag was mixed with magnesium in order to compare its binder properties with that of aluminum. The silver was evaporated in the same manner as the aluminum from an electron beam heated graphite crucible. As shown in Table I, the 62.4% magnesium in silver cathode behaved comparable to the 81.5% magnesium in aluminum cathode, however, all attempts at making a cathode with a magnesium content of less than 50% in silver were unsuccessful due to shorting of the device. This demonstrates that Mg:Al cathodes behave comparably to Mg:Ag cathodes (with high Mg content) but have the added virtue that the concentration of the Mg can be quite low.

EXAMPLE 12 OPERATIONAL STABILITY OF EXAMPLE 1-11 CELLS

Figure 2:
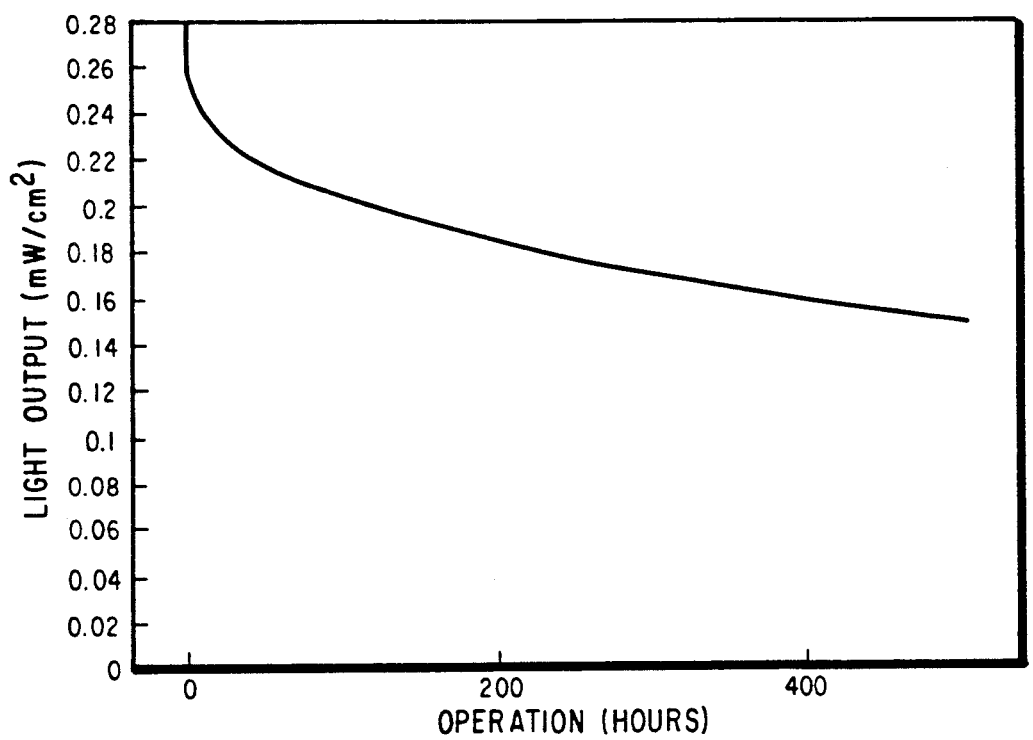
FIG. 2 is a plot of light output in mW/cm$^2$ versus hours of operation.

The internal junction organic EL devices of Examples 1-11 were stability tested under constant current conditions using 1 kHz AC excitation. The current was set at a level which produced the same light output as 20 mA/cm$^2$ direct current. FIG. 2 shows a plot of the normalized light output versus time for the cell described in Example 1E. The light output clearly stayed above 0.1 mW/cm$^2$ for over 1000 hours (initial light output level 0.28 mW/cm$^2$). All of the Example 1-11 cells exhibited about the same normalized drop in light output level, as shown in Table II, with the loss in light output being about 40% after 300 hours operation. The drive voltage increased in each instance, reflecting an increasing cell resistance with continued operation. However, all of the example cells showed a voltage rise of <0.5 volt AC over 300 hours of operation. For the 100% aluminum cathode, the voltage rise was more rapid during operation (increasing about 2 volts AC in the first 300 hours), and the initial efficiency was considerably less, demonstrating the need for a small amount of magnesium to be incorporated in the cathode to achieve optimum performance.

These results demonstrate cathode composition independence on the stability of electroluminescent cells which employ a mixed metal cathode of Mg and Al. Further the mixed metal layer can be quite thin, and a pure aluminum capping layer can be deposited to complete the cathode, but is not required.

TABLE I

| Example No. | Number of cathode layers | Weight percent Mg | Efficiency (W/A) | Voltage at 20 mA/cm$^2$ (Volts) |
| --- | --- | --- | --- | --- |
| 1E | 2 | 1.3 | 0.014 | 9.1 |
| 2C | 1 | 0.0 | 0.010 | 12.5 |
| 3E | 1 | 3.4 | 0.015 | 9.3 |
| 4C | 1 | 39.2 | 0.014 | 9.2 |
| 5C | 1 | 86.6 | 0.015 | 8.6 |
| 6E | 2 | 3.4 | 0.015 | 9.2 |
| 7C | 2 | 39.2 | 0.016 | 8.6 |
| 8C | 2 | 86.6 | 0.016 | 8.4 |
| 9C | 2 | 81.5 | 0.016 | 8.1 |
| 10C | 2* | 62.4 | 0.017 | 7.7 |
| 11C | 2* | 14.2 | shorted | |

*mixed layer is MgAg

TABLE II

| Example No. | No. of cathode layers | Weight % Mg | Initial light output (mW/cm2) | % Initial light output after 300 hours | Voltage rise (AC volts) |
| --- | --- | --- | --- | --- | --- |
| 1E | 2 | 1.3 | 0.28 | 62 | 0.2 |
| 2C | 1 | 0.0 | 0.21 | 60 | 2.0 |
| 3E | 1 | 3.4 | 0.30 | 67 | 0.4 |
| 4C | 1 | 39.2 | 0.28 | 63 | 0.4 |
| 5C | 1 | 86.6 | 0.29 | 63 | 0.7 |
| 6E | 2 | 3.4 | 0.30 | 64 | 0.4 |
| 7C | 2 | 39.2 | 0.31 | 64 | 0.4 |
| 8C | 2 | 86.6 | 0.32 | 63 | 0.6 |
| 9C | 2 | 81.5 | 0.32 | 59 | 0.4 |
| 10C | 2* | 62.4 | 0.33 | 62 | 0.4 |
| 11C | 2* | 14.2 | shorted | | |

*mixed layer is MgAg

The invention has been described in detail with particular reference to preferred embodiments thereof, but it will be understood that variations and modifications can be effected within the spirit and scope of the invention.

What is claimed is:

1. An internal junction organic electroluminescent device comprising in sequence, an anode, an organic hole injecting and transporting zone, an organic electron injecting and transporting zone, and a cathode comprised of a layer contacting the organic electron injecting and transporting zone containing a combination of magnesium and at least one metal having a higher work function than magnesium, characterized in that the one metal having a higher work function than magnesium is aluminum and accounts for at least 80 percent of the cathode layer.

2. An internal junction organic electroluminescent device according to claim 1 further characterized in that said organic electron injecting and transporting zone is comprised of a stilbene or chelated oxinoid compound.

3. An internal junction organic electroluminescent device according to claim 1 further characterized in that said anode is light transmissive.

4. An internal junction organic electroluminescent device according to claim 1 further characterized in that said cathode additionally includes a backing layer comprised of a metal having a higher work function than magnesium.

5. An internal junction organic electroluminescent device according to claim 4 further characterized in that said backing layer is comprised of aluminum.

6. An internal junction organic electroluminescent device according to claim 1 further characterized in that said cathode layer contacting said electron injecting and transporting zone has a thickness of at least 25Å.

7. An internal junction organic electroluminescent device according to claim 6 further characterized in that said cathode layer contacting said electron injecting and transporting zone has a thickness of at least 50Å.

8. An internal junction organic electroluminescent device according to claim 7 further characterized in that said cathode layer contacting said electron injecting and transporting zone has a thickness of at least 100Å.

9. An internal junction organic electroluminescent device according to claim 1 further characterized in that said cathode layer contains at least 0.05 percent magnesium.

10. An internal junction organic electroluminescent device according to claim 9 further characterized in that said cathode layer contains at least 0.1 percent magnesium.

11. An internal junction organic electroluminescent device comprising in sequence, an anode, an organic hole injecting and transporting zone, an organic electron injecting and transporting zone forming a junction with the organic hole injecting and transporting zone, and a cathode comprised of a layer contacting the organic electron injecting and transporting zone containing a combination of magnesium and aluminum,
characterized in that
said electron injecting and transporting zone is comprised of a vacuum vapor deposited stilbene or chelated oxinoi layer and
said cathode layer is deposited on said electron injecting and transporting zone layer in a thickness range of from 50 to 5000Å and is comprised of from 0.1 to 10 percent magnesium and at least 90 percent aluminum.

* * * * *